United States Patent [19]

Williams et al.

[11] Patent Number: 5,647,953
[45] Date of Patent: Jul. 15, 1997

[54] PLASMA CLEANING METHOD FOR REMOVING RESIDUES IN A PLASMA PROCESS CHAMBER

[75] Inventors: Larry Williams, Milpitas; David R. Pirkle, Soquel; William Harshbarger; Timothy Ebel, both of San Jose, all of Calif.

[73] Assignee: LAM Research Corporation, Fremont, Calif.

[21] Appl. No.: 577,340

[22] Filed: Dec. 22, 1995

[51] Int. Cl.$^6$ .................................................. C23C 16/00
[52] U.S. Cl. .................. 156/643.1; 156/646.1; 216/67; 134/1.1; 427/255.3
[58] Field of Search .................. 134/1.1; 216/67; 156/643.1

[56] References Cited

U.S. PATENT DOCUMENTS

| | | | |
|---|---|---|---|
| 4,340,462 | 7/1982 | Koch | 204/298 |
| 4,576,698 | 3/1986 | Gallagher et al. | 204/192 E |
| 4,657,616 | 4/1987 | Benzing et al. | 156/345 |
| 4,749,440 | 6/1988 | Blackwood et al. | 156/646 |
| 4,786,352 | 11/1988 | Benzing | 156/345 |
| 4,816,113 | 3/1989 | Yamazaki | 156/643 |
| 4,842,683 | 6/1989 | Cheng et al. | 156/345 |
| 4,857,139 | 8/1989 | Tashiro et al. | 156/643 |
| 4,948,458 | 8/1990 | Ogle | 156/643 |
| 4,986,877 | 1/1991 | Tachi et al. | 156/643 |
| 5,006,192 | 4/1991 | Deguchi | 156/345 |
| 5,022,958 | 6/1991 | Favreau et al. | 156/643 |
| 5,041,311 | 8/1991 | Tsukune et al. | 427/255.3 |
| 5,089,441 | 2/1992 | Moslehi | 437/225 |
| 5,129,958 | 7/1992 | Nagashima et al. | 134/22.1 |
| 5,158,644 | 10/1992 | Cheung et al. | 156/643 |
| 5,200,232 | 4/1993 | Tappan et al. | 427/569 |
| 5,207,836 | 5/1993 | Chang | 134/1 |
| 5,356,478 | 10/1994 | Chen et al. | 134/1 |
| 5,413,670 | 5/1995 | Langan et al. | 134/1.2 |
| 5,503,676 | 4/1996 | Shufflebotham et al. | 118/723 MR |

FOREIGN PATENT DOCUMENTS

| | | |
|---|---|---|
| 62-214175 | 9/1962 | Japan . |
| 57-201016 | 12/1982 | Japan . |
| 61-250185 | 11/1986 | Japan . |
| 61-136981 | 12/1987 | Japan . |
| 63-267430 | 11/1988 | Japan . |
| 3-62520 | 3/1991 | Japan . |

*Primary Examiner*—R. Bruce Breneman
*Assistant Examiner*—Michael E. Adjodha
*Attorney, Agent, or Firm*—Burns, Doane, Swecker & Mathis, L.L.P.

[57] ABSTRACT

A method for cleaning and conditioning a plasma processing chamber wherein oxide residues have been previously formed on interior surfaces of the chamber. The method includes introducing a cleaning gas including a fluorine-based gas into the chamber followed by performing a plasma cleaning step. The plasma cleaning step is performed by activating the cleaning gas mixture and forming a plasma cleaning gas, contacting interior surfaces of the chamber with the plasma cleaning gas and removing oxide residues on the interior surfaces. The cleaning step is followed by coating the interior surfaces with silicon dioxide to adhere loose particles to the interior surfaces and a conditioning step wherein uncoated interior surfaces are treated to remove fluorine therefrom. An advantage of the cleaning and conditioning method is that it is not necessary to open the chamber. Also, it is possible to remove oxide residues during the cleaning step and remove fluorine remaining after the cleaning step during the conditioning step. The conditioning step is carried out by introducing a hydrogen-containing gas into the chamber as a purge gas or the chamber can be pressurized by the hydrogen-containing gas followed by evacuating the chamber.

23 Claims, No Drawings

PLASMA CLEANING METHOD FOR REMOVING RESIDUES IN A PLASMA PROCESS CHAMBER

FIELD OF THE INVENTION

The invention relates to a method of cleaning of a vacuum treatment apparatus to remove previously deposited residues which have accumulated on interior surfaces of the apparatus. For instance, the method can be used to clean interior surfaces of a plasma process chamber wherein specimens such as silicon wafers or flat panel displays having one or more layers thereon are subjected to semiconductor processing such as chemical vapor deposition ("CVD"), dry etching, resist stripping, etc. In particular, the invention relates to plasma etching to remove residues on electrodes, interior walls, and or other components located within a plasma process chamber.

DESCRIPTION OF THE RELATED ART

It is conventional to dry etch a stack of thin layers which can include a photoresist (for patterning the underlying layers), an anti-reflective coating (also known as an ARC layer, used for covering the surface of the underlying layers), aluminum (or an aluminum alloy), and a barrier material (such as metal, metal compound or silicide). For instance, U.S. Pat. No. 4,986,877 discloses dry etching of aluminum with $Cl_2$, polysilicon with $SF_6$, $SiO_2$ and $Si_3N_4$ with a fluorocarbon and photoresist with $O_2$. U.S. Pat. No. 5,022,958 discloses dry etching a dielectric with $CHF_3+Ar$, removing polymer with pure oxygen and further etching the dielectric with $CHF_3+Ar+CF_4$. Such etching, however, results in residues or deposits building up on surfaces inside the plasma treatment chamber. Similar buildup of deposits occurs in plasma treatment chambers wherein deposition is carried out.

When a film is dry etched in a chlorine-based plasma (or a sequence of chlorine-based and fluorine-based dry etches), residual reaction product (henceforth referred to as "residues") adhere upon surfaces in the plasma treatment chamber. These residues contain metals (or silicates, depending on which type of dry etch is used), chlorine, and organics (or compounds of the aforementioned materials). The surfaces that the residues adhere to include upper and lower electrode surfaces, walls of the plasma treatment chamber, clamping surfaces, and any other item that the plasma or its byproducts come in contact with. A build-up of these residues deteriorates the etch performance of the dry etch. As such, the presence of such residues is undesirable.

Japanese Laid-Open Patent Publication No. 61-250185 discloses a method of removing deposits such as $Si_xCl_y$ on components of a plasma etching device. The components include a high-frequency electrode and interior surfaces of the plasma reaction chamber. Such deposits are formed when aluminum on the wafer is dry etched by a plasma formed from $SiCl_4$. The deposits are removed by contacting the interior surfaces of the chamber with an oxidizing gas which oxidizes the deposits to form $SiO_2$. A plasma is then formed from a fluorine containing gas and the $SiO_2$ is removed. For instance, a gas containing moisture or hydrogen peroxide, ozone, etc., can be introduced in the form of a plasma to promote the reaction:

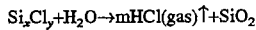

Next, after evacuating the chamber, a gas containing fluorine such as $CF_4$ or $NF_3$, $SF_6$ or $NF_3+O_2$ or $SF_6+O_2$ can be introduced in the form of a plasma to promote the following reaction:

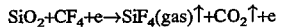

Japanese Laid-Open Patent Publication No. 3-62520 discloses a method of using a plasma formed from chlorine and fluorine to remove a reaction product that remains after etching of an aluminum alloy film and after etching of a barrier metal. For instance, when an overlying aluminum layer such as an Al—Si—Cu, Al—Si or Al—Cu film is etched with chlorine and an underlying barrier layer such as TiW, MoSi, WSi, Ti, TiN or α-Si is etched with fluorine, residual reaction products build up inside the plasma treatment chamber on parts such as electrodes after 10 wafers have been etched. To remove the deposits, a plasma is formed from a gas containing $Cl_2$ alone or $Cl_2+BCl_3$ or $Cl_2+Hcl$ and cleaning is performed for 5 minutes. Then, a gas containing $SF_6$, SF or $C_2F_5$ is converted into plasma and cleaning is performed for 5 minutes. As a result, Al product and Ti product form $AlCl_2$ and $TiCl_2$ which is removed during $Cl_2$ plasma cleaning and W product forms $WF_5$ which is removed during $SF_6$ plasma cleaning.

U.S. Pat. No. 4,786,352 discloses a method of cleaning silicon oxide in a low pressure chemical vapor deposition (LPCVD) chamber using a cleaning gas which is decomposed to create etchant species in a plasma. The cleaning gases include $CF_4$, $CF_4+O_2$, $C_2F_6$, $SF_6$ or $NF_3$. Other cleaning gases include $CF_3Cl$, $CF_3Br$, $CCl_4$, $Bcl_3$, $Cl_2$, Hcl, $O_2$ and combinations with or without inert gases.

U.S. Pat. No. 4,576,698 discloses plasma cleaning of deposition products which build-up in a deposition chamber wherein the cleaning gas is P. D. 100. U.S. Pat. No. 4,749,440 discloses a method of cleaning oxide deposits on quartz boats. U.S. Pat. No. 4,816,113 discloses a process of removing carbon deposits inside a chamber with oxygen plasma. U.S. Pat. No. 5,356,478 discloses a plasma cleaning method for removing residues from a plasma treatment chamber by introducing a mixture of an oxidizing gas, chlorine-containing gas and optional fluorine-based gas.

U.S. Pat. No. 5,129,958 discloses a method for cleaning a CVD deposition chamber in a semiconductor wafer processing apparatus wherein fluorine residues in the chamber, left from a prior fluorine plasma cleaning step, are contacted with one or more reducing gases such as silane ($SiH_4$), ammonia, hydrogen, phosphine ($PH_3$), diborane ($B_2H_6$), and arsine ($AsH_3$). The fluorine residues are contacted by the reducing gas or gases for ten seconds to five minutes or longer and the reducing gas or gases are introduced into the chamber at a rate of 100 sccm to 500 sccm or higher while maintaining the temperature in the chamber at 250°–500° C. In an example, the chamber was maintained at 1–20 Torr during the reaction between the reducing gas or gases and the fluorine residues or the pressure can range from $10^{-3}$ Torr to 100 Torr during the reaction.

Various techniques for cleaning plasma reaction chambers are disclosed in commonly owned U.S. Pat. No. 5,356,478; in U.S. Pat. Nos. 4,657,616; 4,786,352; 4,816,113; 4,842, 683, 4,857,139; 5,006,192; 5,129,958; 5,158,644 and 5,207, 836 and Japanese Laid-Open Patent Publication Nos. 57-201016; 61-250185, 62-214175, 63-267430 and 3-62520. For instance, in order to remove $SiO_x$ deposits, a fluorine-containing gas energized into a plasma has been used to clean interior surfaces of the chamber. Fluorine residues remaining after the reactor cleaning can be removed by passing a reducing gas such as hydrogen ($H_2$), silane ($SiH_4$), ammonia ($NH_4$), phosphine ($PH_3$), biborine ($B_2H_6$) or arsine ($ArH_3$) through the reactor.

In view of the state of the art, there still exists a need for an in-situ reactor cleaning process which effectively removes deposits on interior surfaces yet conditions the surfaces to avoid particle contamination and/or undesirable liberation of absorbed impurities such as fluorine which can adversely affect subsequent substrate processing in the reactor.

SUMMARY OF THE INVENTION

The invention provides a plasma cleaning method for removing residues in a plasma process chamber wherein substrate are processed. The method includes performing a fluorine-based plasma cleaning step by activating a fluorine-based cleaning gas mixture and forming a plasma containing the cleaning gas, contacting interior surfaces of the chamber with the plasma cleaning gas and removing residues on the interior surfaces. The fluorine-based plasma etch is followed by a coating treatment and a conditioning treatment of interior surfaces of the chamber.

The cleaning gas can include additional components such as an oxygen-containing gas and a carrier gas. The cleaning gas preferably comprises 100% by volume of the fluorine-based gas which can comprise $NF_3$, $SF_6$, a fluorocarbon or mixture thereof or the cleaning gas can include $\leq 10\%$ of the oxygen-containing gas and/or $\leq 10$ volume % of the inert gas such as argon. The fluorocarbon can comprise $CF_4$, $C_2F_6$ or mixture thereof. The oxygen-containing gas is preferably $O_2$ and/or $H_2O$, $H_2O_2$, $O_3$ or mixture thereof in amounts up to 10 volume % of the cleaning gas. The carrier gas can comprise any suitable gas such as argon in amounts up to 10 volume % of the cleaning gas. The coating gas can comprise $SiH_4$, $O_2$ and Ar with $O_2$ and $SiH_4$ being present in a ratio of $O_2$:$SiH_4$ of 1.3–4:1.

The plasma cleaning gas removes. Oxide in the form of gas by-products. For instance, oxides in the residues can be convened into a gaseous form via reaction with the fluorine of the plasma cleaning gas.

The cleaning step can be carried out at any suitable pressure while generating the chamber cleaning plasma. For instance, the pressure in the chamber can be less than about 600 mTorr. As a specific example, the chamber pressure can be at about 400 mTorr. During the plasma cleaning step, water-cooled components within the chamber can be maintained at ambient or below 100° C.

As a result of this plasma cleaning procedure, the residues can be removed without opening the chamber. For instance, the cleaning step can be performed following substrate processing wherein one or more oxide layers are deposited on a substrate such as a semiconductor wafer or flat panel display and the processing results in oxides being deposited on interior surfaces of the chamber. As an example, the cleaning step can be performed after coating several hundred silicon wafers with a layer of $SiO_x$.

The conditioning step can be carried out by flowing a hydrogen-containing gas such as $SiH_4$ through the chamber. Alternatively, the conditioning step can be carried out by flowing the hydrogen-containing gas into the chamber and building up pressure to 0.25 to 1 Torr therein followed by suddenly evacuating the chamber and removing the hydrogen-containing gas and loose particles from the chamber.

DETAILED DESCRIPTION OF THE PREFERRED EMBODIMENTS

The invention provides a new and improved method of removing oxide residues from interior surfaces of a plasma process chamber and conditioning the interior surfaces prior to processing of substrates such as semiconductor wafers or flat panel displays. Such residues are produced when multilayer structures are fabricated in the plasma process chamber.

The method is particularly effective in cleaning plasma enhanced CVD ("PECVD") reactors such as ECR process chambers having a plasma generating chamber and a plasma reaction chamber or parallel-plate or TCP plasma etching reactors wherein the plasma is generated and one or more substrates are processed in a single process chamber. Examples of CVD and etch reactors are disclosed in commonly owned U.S. Pat. Nos. 4,340,462; 4,948,458 and 5,200,232, the disclosures of which are hereby incorporated by reference.

According to the invention, plasma formed from a fluorine-containing gas is used to remove residues from the interior surfaces of a plasma process chamber. Depending on completeness of the reactions in converting the solid residues into gaseous form, it may be possible to completely clean the plasma chamber such that no by-products remain in the chamber. However, some residues in the form of loose particles are likely to remain in the chamber after the plasma cleaning step.

According to the invention, the fluorine-based plasma etch is carried out on the interior surfaces of the chamber. Subsequently, a silicon dioxide coating applied on the interior surfaces of the chamber to adhere the loose particles to the interior surfaces after which a conditioning treatment is carried out in the chamber to remove residual fluorine adsorbed on interior surfaces which remain uncoated after the coating step.

The fluorine-based plasma cleaning step can be carried out using 100% by volume of a fluorine-containing gas such as $NF_3$. However, the plasma cleaning gas can include $\leq 10\%$ by volume of an oxygen-containing gas such as $O_2$ and/or $\leq 10\%$ by volume of a carrier gas such as Ar. The plasma cleaning step is carried out for a time sufficient to remove oxide deposits on the interior surfaces of the chamber. Typically, the plasma cleaning step is carried out for 60–90 seconds for each micron of the oxide film to be removed from the interior surfaces. The oxide film to be removed is typically $SiO_2$ but the oxide film may include dopants such as P or F.

The coating step provides a silicon dioxide coating which traps F and/or Al on interior surfaces located in the vicinity of the substrate support. Interior surfaces in more remote portions of the chamber will not be coated to any significant extent in the coating step. Any suitable coating gas chemistry can be utilized in the coating step. The coating step can be carried out for a time sufficient to provide a silicon oxide coating having a thickness such as 2000 Å to 2 μm. A suitable coating gas includes $SiH_4$, $O_2$ and Ar wherein the ratio of $O_2$:$SiH_4$ is 1.3–4:1. As an example, the coating gas can include 200 sccm $SiH_4$, 365 sccm $O_2$ and 80 sccm Ar. The amount of Ar, however, can vary from 40 to 160 sccm without effecting the quality of the deposited $SiO_2$ film.

The conditioning step is carried out to remove fluorine from interior surfaces which are not coated in the coating step. Preferably, the fluorine is converted to $SiF_4$ and/or $HF_4$. The non-plasma conditioning gas includes a hydrogen-containing gas and preferably hydrogen and silicon-containing gas such as $SiH_4$ which is introduced into the chamber in a non-plasma state. The non-plasma conditioning gas can be passed through the reactor as a purge gas or the non-plasma conditioning gas can be introduced into the chamber so as to build up pressure in the chamber followed by suddenly evacuating the chamber. In the latter case, loose particles can be advantageously removed from the chamber along with the $SiF_4$ and/or $HF_4$. Typically, the conditioning step is carried out for sixty seconds to three minutes using $SiH_4$ as the conditioning gas. However, the conditioning gas could be partially or entirely replaced with hydrogen-containing gases such as disilane ($Si_2H_2$), hydrogen, and/or water vapor whereby the fluorine could be removed in the form of $HF_4$. The amount of conditioning gas introduced into the reactor is limited to the reactor design. That is, in a typical reactor design the upper limit of the flow rate of the conditioning gas may be limited to 300 sccm.

In plasma cleaning a CVD reactor of the type disclosed in U.S. Pat. No. 5,200,232, the plasma cleaning step is carried out while maintaining the chamber walls and components of the reactor such as a horn, substrate support and shield surrounding the substrate support at ambient or at a temperature less than 100° C. For instance, all surfaces within the chamber can be water cooled aluminum surfaces, the walls being cooled by water at ambient temperature and the horn, shield and substrate support being coated by water heated to 70° C. Thus, during the coating step the interior chamber surfaces are below 100° C.

During the cleaning step, some reaction products are absorbed onto the cold surfaces which are not coated in the coating step and if such products are not removed they could affect subsequent substrate processing (e.g., F and/or Al could be introduced into substrates such as wafers processed after the cleaning procedure). It has been found that use of $SiH_4$ as the conditioning gas reduces the amount of fluorine retained on remote portions of the interior surfaces of the reactor. The $SiH_4$ is introduced into the reactor in a non-plasma state and is effective in forming $SiF_4$ which is removed in a gaseous state.

The conditioning step can be carried out by introducing the conditioning gas into the chamber until the pressure in the chamber builds up, for example, to 1 Torr followed by evacuating the chamber to pump out $SiF_4$ and/or $HF_4$ along with loose particles. As an example, $SiH_4$ can be introduced into the chamber and the pressure can be built up to 0.5 Torr followed by opening a gate valve leading to a large pump whereby the gases and loose particles in the chamber can be pumped out of the chamber. After evacuating the gases and loose particles, the chamber is ready for further substrate processing such as depositing silicon-dioxide layers on semiconductor wafers.

The invention is now explained with reference to the following non-limiting example.

EXAMPLE

Accumulated build-up of $SiO_2$, reduction of particle contamination and improved adhesion of a deposited $SiO_x$ film on interior surfaces of a plasma process chamber having water cooled aluminum surfaces can be achieved by the following process.

After a series of substrates such as silicon semiconductor wafers are processed by depositing $SiO_x$ thereon in an ECR chamber, the ECR chamber is evacuated to a pressure of 400–600 mTorr, filled with pure $NF_3$ gas injected at 600 sccm and the $NF_3$ gas is energized into a plasma while maintaining chamber walls at ambient and the horn and shield surrounding the substrate support at 70° C. The plasma removes 1 μm of $SiO_2$ from the interior surfaces in about 60–90 seconds. Cleaning of interior surfaces including water cooled parts such as a horn, substrate support and surrounding shield is then carried out for about 6 minutes.

After cleaning is completed, the $NF_3$ flow is terminated and $SiH_4$, $O_2$ and Ar are injected at about 200 sccm $SiH_4$, 365 sccm $O_2$ and 80 sccm Ar while maintaining the reactor at a pressure of $\leq 10$ mTorr. The $SiH_4$, $O_2$ and Ar gases are energized for about 1½ minutes to form a plasma which effects coating of interior surfaces of the reactor with an $SiO_x$ film having a thickness of about 3000 Å. During the coating step the walls are maintained at ambient and the horn and shield are maintained at 70° C. This coating step is effective in trapping F and Al in a silicon dioxide coating and sticking particles not removed in the cleaning step to the reactor interior surfaces. However, with a 24" diameter chamber, the coating step may only coat about 15" of the bottom reactor surface and very little of the coating may be applied to the sidewalls of the reactor.

Fluorine remaining after the cleaning step will either be coated with the $SiO_x$ film or remain absorbed on uncoated interior surfaces. To eliminate the absorbed fluorine, $SiH_4$ is injected into the reactor at about 300 sccm and the reactor is not energized so that the $SiH_4$ remains in a non-plasma state. The conditioning step is carried out for about 1 to 3 minutes with the reactor at a pressure of about 0.5 Torr. During the condition step, the walls are maintained at ambient and the horn and shield are maintained at 70° C.

To remove loose particles in the reactor, the reactor can then be quickly evacuated simply by opening a gate valve. For instance, pressure in the reactor can be built up to about 0.5 to 1 Torr prior to pumping out the chamber.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A plasma cleaning method for removing oxide residues in a plasma process chamber wherein substrates are processed, comprising steps of:

introducing a cleaning gas comprising a fluorine-based gas into the plasma process chamber;

performing a plasma cleaning step by activating the cleaning gas and forming a plasma cleaning gas, contacting interior surfaces of the chamber with the plasma cleaning gas for a time sufficient to remove oxide residues on the interior surfaces;

coating the interior surfaces with silicon dioxide, the coating step being carried out by introducing a coating gas mixture comprising a silicon-containing gas into the chamber, activating the coating gas mixture and forming a plasma coating gas, and contacting the interior surfaces with the plasma coating gas until the interior surfaces are coated with silicon dioxide; and conditioning uncoated interior surfaces by introducing a conditioning gas comprising a hydrogen-containing gas into the chamber, contacting the interior surfaces with the conditioning gas in a non-plasma state for a time sufficient to remove fluorine from the interior surfaces.

2. The method of claim 1, wherein the fluorine-based gas comprises 100% by volume of the cleaning gas.

3. The method of claim 1, wherein the cleaning gas further comprises $\leq 10$ volume % of an oxygen-containing gas.

4. The method of claim 1, wherein the cleaning gas further contains $\leq 10$ volume % of argon.

5. The method of claim 1, wherein the hydrogen-containing gas comprises $SiH_4$.

6. The method of claim 1, wherein the fluorine-based gas comprises $NF_3$, $SF_6$, a fluorocarbon or mixture thereof.

7. The method of claim 6, wherein the fluorocarbon comprises $CF_4$, $C_2F_6$ or mixture thereof.

8. The method of claim 1, wherein the plasma cleaning gas converts silicon dioxide on the interior surfaces to gas by-products.

9. The method of claim 1, wherein the chamber is evacuated during the cleaning step.

10. The method of claim 1, wherein the conditioning step is carried out by flowing the hydrogen-containing gas through the chamber.

11. The method of claim 1, wherein the conditioning step is carried out by flowing the hydrogen-containing gas into the chamber and building up pressure to 0.25 to 1 Torr therein followed by suddenly evacuating the chamber and removing the hydrogen-containing gas and loose particles therefrom.

12. The method of claim 1, further comprising a step of depositing one or more layers on at least one semiconductor substrate in the chamber prior to the plasma cleaning step, the layers including at least one oxide film and the depositing step causing oxide residues to be deposited on interior surfaces of the chamber.

13. The method of claim 12, wherein the oxide residues are removed by the plasma cleaning gas.

14. The method of claim 1, wherein the conditioning step removes fluorine from the interior surfaces in the form of $SiF_4$ and $HF_4$.

15. The method of claim 1, wherein the coating step is carried out until the coating has a thickness of 2000 Å to 2 µm.

16. The method of claim 1, wherein the conditioning step is followed by introducing a substrate into the chamber and depositing an oxide layer on the substrate.

17. The method of claim 1, wherein the plasma cleaning gas is generated in a plasma generating chamber of an ECR reactor and the coating step coats interior surfaces in a substrate treatment chamber located adjacent the plasma generating chamber.

18. The method of claim 1, wherein the chamber is located in an ECR reactor.

19. The method of claim 1, wherein the silicon dioxide is coated directly on the interior surfaces during the coating step.

20. The method of claim 1, wherein the interior surfaces are maintained at a temperature below 100° C. during the conditioning step.

21. A plasma cleaning method for removing oxide residues in a plasma process chamber wherein substrates are processed, comprising steps of:

introducing a cleaning gas comprising a fluorine-based gas into the plasma process chamber;

performing a plasma cleaning step by activating the cleaning gas and forming a plasma cleaning gas, contacting interior surfaces of the chamber with the plasma cleaning gas for a time sufficient to remove oxide residues on the interior surfaces;

coating the interior surfaces with silicon dioxide, the coating step being carried out by introducing a coating gas mixture comprising a silicon-containing gas into the chamber, activating the coating gas mixture and forming a plasma coating gas, and contacting the interior surfaces with the plasma coating gas until the interior surfaces are coated with silicon dioxide; the coating gas comprising $SiH_4$, $O_2$ and Ar and conditioning uncoated interior surfaces by introducing a conditioning gas comprising a hydrogen-containing gas into the chamber, contacting the interior surfaces with the conditioning gas in a non-plasma state for a time sufficient to remove fluorine from the interior surfaces.

22. The method of claim 21, wherein the $O_2$ and $SiH_4$ are present in a ratio of $O_2:SiH_4$ of 1.3–4:1.

23. A plasma cleaning method for removing oxide residues in a plasma process chamber wherein substrates are processed, comprising steps of:

introducing a cleaning gas comprising a fluorine-based gas into the plasma process chamber;

performing a plasma cleaning step by activating the cleaning gas and forming a plasma cleaning gas, contacting interior surfaces of the chamber with the plasma cleaning gas for a time sufficient to remove oxide residues on the interior surfaces;

coating the interior surfaces with silicon dioxide, the coating step being carried out by introducing a coating gas mixture comprising a silicon-containing gas into the chamber, activating the coating gas mixture and forming a plasma coating gas, and contacting the interior surfaces with the plasma coating gas until the interior surfaces are coated with silicon dioxide;

conditioning uncoated interior surfaces by introducing a conditioning gas comprising a hydrogen-containing gas into the chamber, contacting the interior surfaces with the conditioning gas in a non-plasma state for a time sufficient to remove fluorine from the interior surfaces; and the chamber being located in an ECR reactor and including water-cooled aluminum chamber walls and at least one water-cooled aluminum component maintained at a temperature of less than 100° C. during the plasma cleaning step, the component being coated with a silicon dioxide coating which traps Al and F in the coating.

* * * * *

UNITED STATES PATENT AND TRADEMARK OFFICE
CERTIFICATE OF CORRECTION

PATENT NO. : 5,647,953

DATED : July 15, 1997

INVENTOR(S) : Larry Williams, et al.

It is certified that an error appears in the above-identified patent and that said Letters Patent is hereby corrected as shown below:

```
In Column 3, line 32, after "removes", delete --.  Oxide-- and insert
"oxide";

Column 4, line 59, delete --HF₄-- and insert "HF";

Column 5, line 2, delete --HF₄-- and insert "HF";

Column 5, line 6, delete --(Si₂H₂)-- and insert "(Si₂H₆)";

Column 5, line 8, delete --HF₄-- and insert "HF";

Column 5, line 37, delete --HF₄-- and insert "HF";

Column 5, line 54, delete --.-- and insert ":";

Column 6, line 5, delete --3000-- and insert "6000"; and

Column 7, line 29, delete --HF₄-- and insert "HF".
```

Signed and Sealed this

Nineteenth Day of May, 1998

Attest:

BRUCE LEHMAN

*Attesting Officer*   Commissioner of Patents and Trademarks